US005532968A

United States Patent [19]
Lee

[11] Patent Number: 5,532,968
[45] Date of Patent: Jul. 2, 1996

[54] SELF REFRESH CONTROL CIRCUIT FOR MEMORY CELL ARRAY

[75] Inventor: Jae S. Lee, Seoul, Rep. of Korea

[73] Assignee: Goldstar Electron Co., Ltd., Choongchungbook-Do, Rep. of Korea

[21] Appl. No.: 392,444

[22] Filed: Feb. 22, 1995

[30] Foreign Application Priority Data

Apr. 21, 1994 [KR] Rep. of Korea ............... 8459/1994

[51] Int. Cl.$^6$ .................................................. G11C 7/00
[52] U.S. Cl. .............. 365/222; 365/189.07; 365/189.09; 365/193; 365/236
[58] Field of Search ................... 365/222, 189.07, 365/189.09, 193, 236, 230.08

[56] References Cited

U.S. PATENT DOCUMENTS

| | | | |
|---|---|---|---|
| 4,982,369 | 1/1991 | Tatematsu | 365/222 |
| 4,984,210 | 1/1991 | Kumanoya et al. | 365/222 |
| 5,027,327 | 6/1991 | Kobayashi et al. | 365/222 |
| 5,375,093 | 12/1994 | Hirano | 365/222 |
| 5,406,522 | 4/1995 | Hirano | 365/222 |
| 5,479,372 | 12/1995 | Sato et al. | 365/222 |

*Primary Examiner*—Do Hyun Yoo
*Attorney, Agent, or Firm*—Lowe, Price, LeBlanc & Becker

[57] ABSTRACT

A self refresh control circuit for a memory cell array including a plurality of address buffers for inputting addresses of the memory cell array and a plurality of decoders for decoding the addresses from the address buffers. The self refresh control circuit further includes a self refresh mode control circuit for controlling a self refresh operation of the memory cell array in response to a row address strobe signal and a column address strobe signal, a reference voltage generator for generating a plurality of reference voltages, each of the reference voltages being nearly constant in level regardless of a temperature variation in a chip, and a temperature tracing circuit for generating a voltage variable with the temperature variation in the chip, comparing the generated variable voltage with the reference voltages from the reference voltage generator, respectively, selecting a desired one of a plurality of self refresh periods from the self refresh mode control circuit in accordance with the compared results and outputting the selected self refresh period to the self refresh mode control circuit.

17 Claims, 7 Drawing Sheets

SELF REFRESH PERIOD

IDEAL SELF REFRESH PERIOD
BASED ON TEMPERATURE VARIATION

| TEMPERATURE REGION \ TEMPERATURE OUTPUT | TC1 | TC2 | TC3 |
|---|---|---|---|
| AA | H | H | H |
| BB | L | H | H |
| CC | L | L | H |
| DD | L | L | L |

SELF REFRESH CONTROL CIRCUIT FOR MEMORY CELL ARRAY

BACKGROUND OF THE INVENTION

1. Field of the Invention

The present invention relates in general to a circuit for controlling a self refresh operation of a memory cell array, and more particularly to a self refresh control circuit for the memory cell array which is capable of adjusting variably a self refresh period of the memory cell array according to a temperature variation in a chip to reduce an amount of current required to hold data stored in the memory cell array.

2. Description of the Prior Art

Generally, a dynamic memory device comprises a plurality of memory cells and an amount of charge stored on a capacitor of each memory cell is reduced due to a leakage with the lapse of time. For this reason, a refresh operation is periodically performed to recover the leakage charge amount on the capacitor. If a refresh period is too long, the leakage charge amount on the capacitor becomes large, thereby making it impossible to discriminate whether data stored in the memory cell is "1" or "0" in logic. Here, a critical time required to 11old the data stored in the memory cell in the refresh interval is called a data hold time. The refresh operation is performed at a desired period to hold the data stored in the memory cell, which is called as a self refresh (SR) operation. The self refresh operation is performed in a self refresh mode. Noticeably, a self refresh period must be set to refresh all the memory cells in the dynamic memory device at least once in the data hold time.

FIG. 1 is a graph illustrating a general relationship between the data hold time and the self refresh period based on a temperature variation. As an ambient temperature rises, the leakage charge amount on the capacitor is increased, thereby causing the data hold time to be shortened. Namely, as shown in FIG. 1, the self refresh period is constant regardless of the variation of the ambient temperature, whereas the data hold time becomes gradually short as the ambient temperature rises. For this reason, the self refresh period must be determined by way of precaution against the worst condition or the very high temperature.

However, in the case where the self refresh period is set by way of precaution against the worst condition, the self refresh operation is performed excessively frequently when the ambient temperature is normal, resulting in an unnecessary loss in an amount of current. For this reason, in order to prevent the unnecessary loss in the current amount due to the self refresh operation, it is necessary to adjust the self refresh period according to a variation in the data hold time with the temperature variation.

FIG. 2 is a graph illustrating an ideal relationship between the data hold time and the self refresh period based on the temperature variation. From this drawing, it can be seen that the self refresh period must be adjusted to be long in the case where the data hold time is long at a low temperature. Also, in the case where the data hold time is short at a high temperature, the self refresh period must be adjusted to be short. In FIG. 2, the reference numerals M and M' designate margins between the data hold time and the self refresh period at the high and low temperatures, respectively. As seen from FIG. 2, the margins M and M' at the high and low temperatures are substantially the same, namely, M≈M'.

In order to solve the above problem, a conventional self refresh control circuit comprises a temperature compensation circuit to generate a self refresh request signal at a shorter period at the high temperature, whereas at a longer period at the low temperature, so as to reduce power consumption in the self refresh mode.

However, such a conventional self refresh control circuit has a disadvantage in that a temperature variation of a memory cell array in the memory device cannot accurately be compensated because a temperature sensor is disposed in the outside of the memory device. Also, the temperature variation of the memory cell array cannot accurately be compensated since temperatures sensed by the temperature sensor are classified into only two regions, high and low temperatures. Further, timers are operated at periods different according to the temperature regions, resulting in an increase in the power consumption and an increase in a layout area.

SUMMARY OF THE INVENTION

Therefore, the present invention has been made in view of the above problems, and it is an object of the present invention to provide a self refresh control circuit for a memory cell array in which a temperature sensor is disposed in a memory device and temperatures sensed by the temperature sensor are classified into a plurality of regions, so that a temperature variation of the memory cell array can accurately be sensed and a self refresh period can be adjusted according to the accurately sensed temperature variation of the memory cell array, and a single timer is used to generate a plurality of self refresh periods, so that a chip area can be reduced.

In accordance with the present invention, the above and other objects can be accomplished by a provision of a self refresh control circuit for a memory cell array comprising a plurality of address buffers for inputting addresses of said memory cell array and a plurality of decoders for decoding the addresses from said address buffers, wherein the improvement comprises self refresh mode control means for controlling a self refresh operation of said memory cell array in response to a row address strobe signal and a column address strobe signal; reference voltage generation means for generating a plurality of reference voltages, each of said reference voltages being nearly constant in level regardless of a temperature variation in a chip; and temperature tracing means for generating a voltage variable with the temperature variation in the chip, comparing the generated variable voltage with the reference voltages from said reference voltage generation means, respectively, selecting a desired one of a plurality of self refresh periods from said self refresh mode control means in accordance with the compared results and outputting the selected self refresh period to said self refresh mode control means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 4:
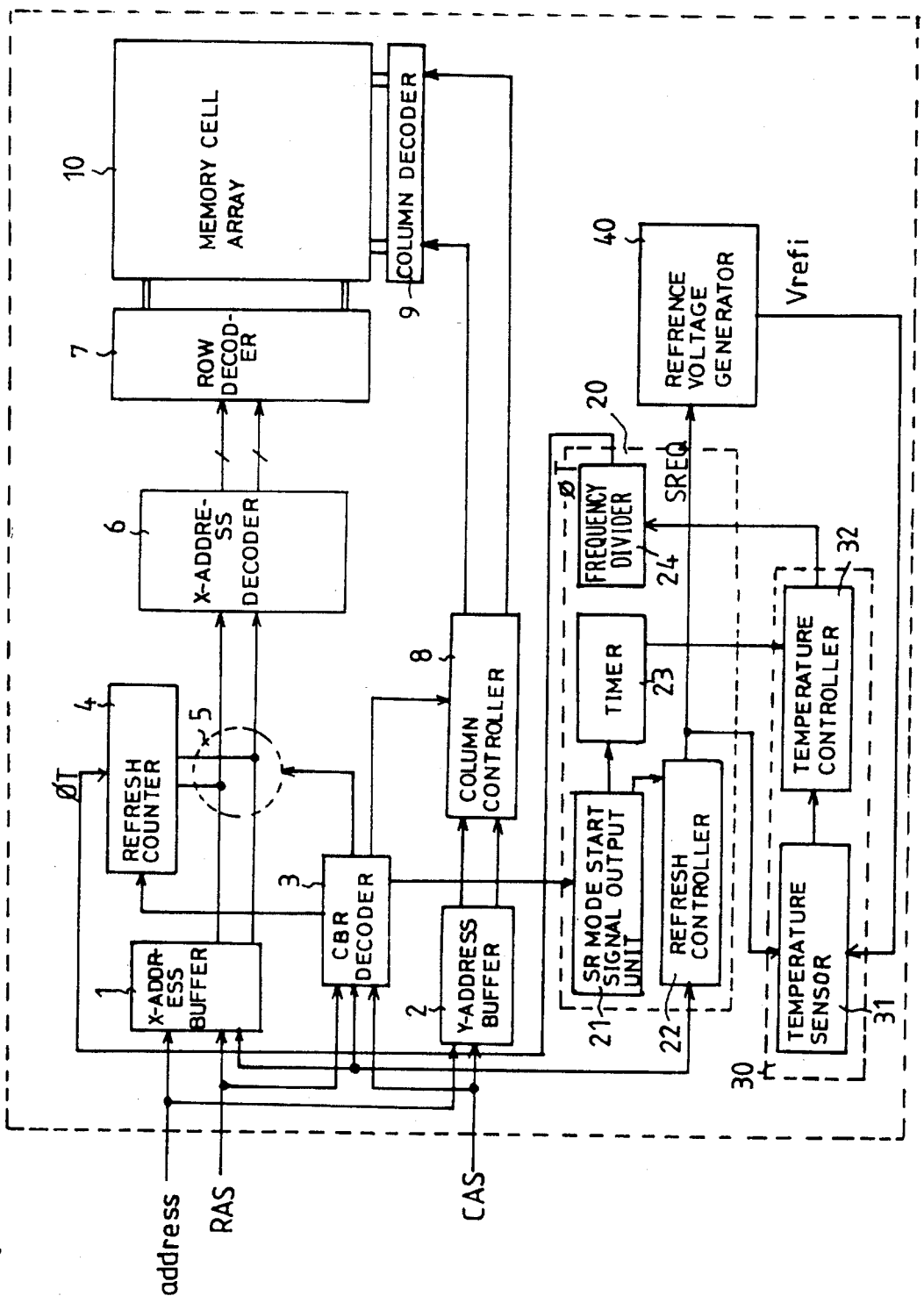
FIG. 4 is a block diagram of a self refresh control circuit for a memory cell array in accordance with the present invention.

Referring to FIG. 4, there is shown a block diagram of a self refresh control circuit for a memory cell array in accordance with the present invention in which the memory cell array is designated by the reference numeral 10. The memory cell array 10 is adapted to store data therein.

As shown in FIG. 4, the self refresh control circuit comprises an X-address buffer 1 for inputting a row address in response to a row address strobe signal RAS, a Y-address buffer 2 for inputting a column address in response to a column address strobe signal CAS, a CBR decoder 3 for generating a desired control signal in response to the row and column address strobe signals RAS and CAS, a refresh counter 4 for generating a self refresh operating signal at a desired period to hold the data stored in the memory cell array 10, a multiplexer 5 for selecting the row address from the X-address buffer 1 in a normal mode and an output signal from the refresh counter 4 in a self refresh mode under the control of the CBR decoder, an X-address decoder 6 for decoding an output signal from the multiplexer 5, and a row decoder 7 for selecting a word line of the memory cell array 10 in response to an output signal from the X-address decoder 6.

The self refresh control circuit also comprises a column controller 8 for decoding the column address from the Y-address buffer 2 under the control of the CBR decoder 3, a column decoder 9 for selecting data input/output paths of the memory cell array 10 in response to an output signal from the column controller 8, an SR mode control circuit 20 for generating a plurality of self refresh periods variable with a temperature variation 5 under the control of the CBR decoder 3, a reference voltage generator 40 for generating a plurality of reference voltages in response to an output signal from the SR mode control circuit 20, and a temperature tracing circuit 30 for selecting a desired one of the plurality of self refresh periods from the SR mode control circuit 20 according to the temperature variation in response to output signals from the SR mode control circuit 20 and the o reference voltage generator 40 and outputting the selected self refresh period to the SR mode control circuit 20.

The SR mode control circuit 20 includes an SR mode start signal output unit 21 for outputting an SR mode start signal under the control of the CBR decoder 3, a timer 23 for generating the plurality of self refresh periods in response to the SR mode start signal from the SR mode start signal output unit 21 and outputting the generated self refresh periods to the temperature tracing circuit 30, a refresh controller 22 for outputting a self refresh request signal in response to the SR mode start signal from the SR mode start signal output unit 21, and a frequency divider 24 for inputting the selected self refresh period from the temperature tracing circuit 30 and outputting a time-divided timing signal $\phi_T$.

The temperature tracing circuit 30 includes a temperature sensor 31 for generating a voltage variable with the temperature variation and comparing the generated variable voltage with the plurality of the reference voltages from the reference voltage generator 40, respectively, and a temperature controller 32 for selecting the desired one of the plurality of self refresh periods from the self refresh mode control circuit 20 in response to a plurality of output signals from the temperature sensor 31 and outputting the selected self refresh period to the self refresh mode control circuit 20.

The operation of the self refresh control circuit with the above-mentioned construction will hereinafter be described in detail.

First, in the normal mode, the row address strobe signal RAS is applied to the X-address buffer 1 and the column address strobe signal CAS is applied to the Y-address buffer 2. Also, the row and column address strobe signals RAS and CAS are applied to the CBR decoder 3. The X-address buffer 1 inputs the row address in response to the row address strobe signal RAS and the Y-address buffer 2 inputs the column address in response to the column address strobe signal CAS. The CBR decoder 3 controls the multiplexer 5 and the column controller 8 in response to the row and column address strobe signals RAS and CAS so that the output signals from the X and Y-address buffers 1 and 2 can be transferred to the X-address decoder 6 and the column decoder 9, respectively. Then, the X-address decoder 6 decodes the X-address from the X-address buffer 1 transferred through the multiplexer 5 and outputs the decoded signal to the row decoder 7. The row decoder 7 decodes the output signal from the X-address decoder 6 and outputs the decoded signal to the memory cell array 10 to designate the row address thereof. Also, the column decoder 9 decodes the output signal from the column controller 8 and outputs the decoded signal to the memory cell array 10 to designate the column address thereof. As a result, the data is written or read into or from a location of the memory cell array 10 corresponding to the row and column addresses from the row and column decoders 7 and 9.

On the other hand, in the case where the row and column addresses are not applied to the X and Y-address buffers 1 and 2 within a predetermined time period after the row and column address strobe signals RAS and CAS are inputted, the CBR decoder 3 recognizes the present mode as the self refresh mode and controls the SR mode control circuit 20 to start the self refresh operation. Also, the CBR decoder 3 controls the multiplexer 5 to block the output signal from the X-address buffer 1 to the X-address decoder 6 and select the output signal from the refresh counter 4. Further, the CBR decoder 3 controls the column controller 8 to block the output signal from the Y-address buffer 2 to the column decoder 9.

In the SR mode controller 20, the SR mode start signal output unit 21 operates the refresh controller 22 and the timer 23 in response to the control signal from the CBR decoder 3. As being operated, the refresh controller 22 outputs the self refresh request signal SREQ to the reference voltage generator 40 and the temperature tracing circuit 30. When the self refresh request signal SREQ from the refresh controller 22 is high in logic, the reference voltage generator 40 generates the reference voltages. Then, the self refresh request signal SREQ from the refresh controller 22 and the reference voltages from the reference voltage generator 40 are applied to the temperature sensor 31 in the temperature tracing circuit 30.

Figure 1:
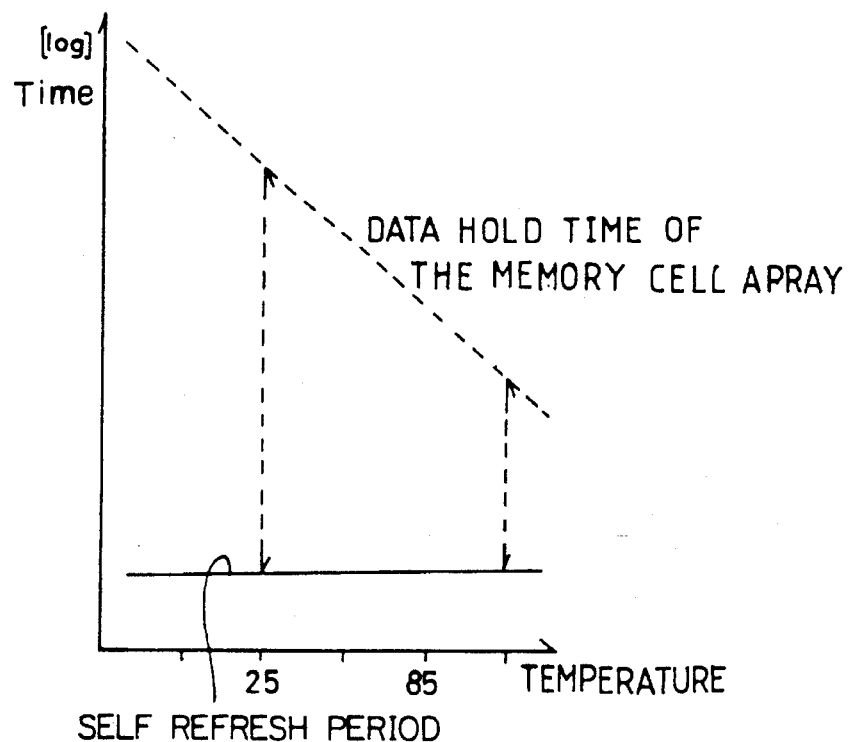
FIG. 1 is a graph illustrating a general relationship between a data hold time and refresh period based on a temperature variation.
Figure 2:
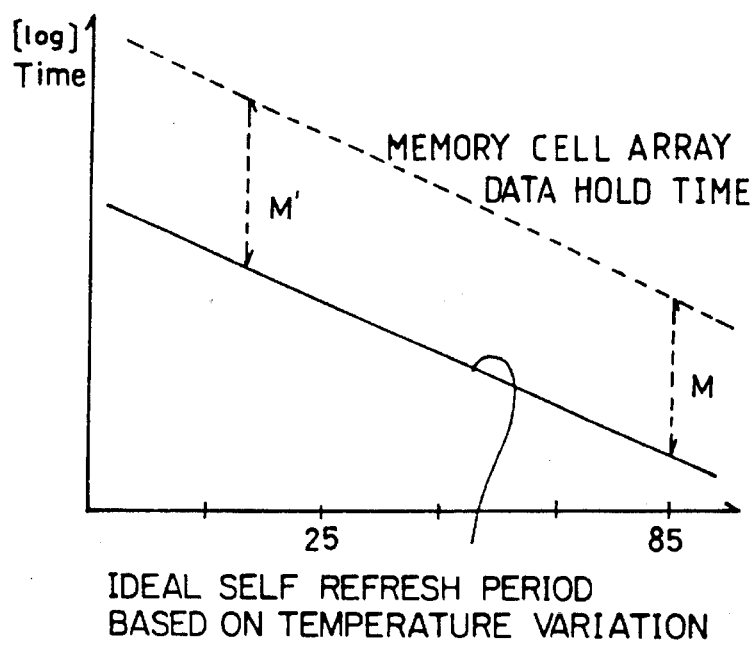
FIG. 2 is a graph illustrating an ideal relationship between the data hold time and the self refresh period based on the temperature variation.
Figure 3:
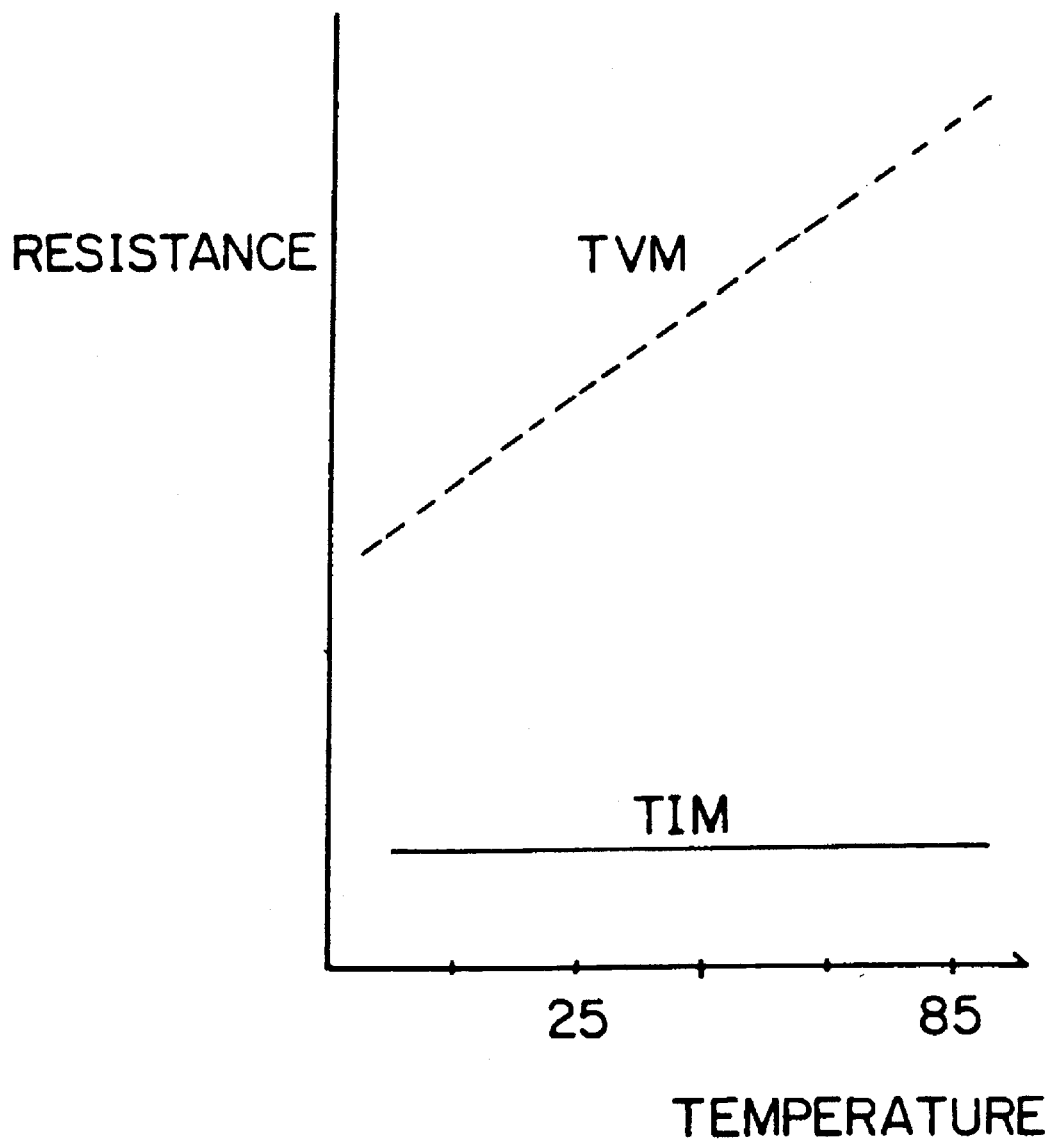
FIG. 3 is a graph illustrating properties of resistors based on the temperature variation.
Figure 5:
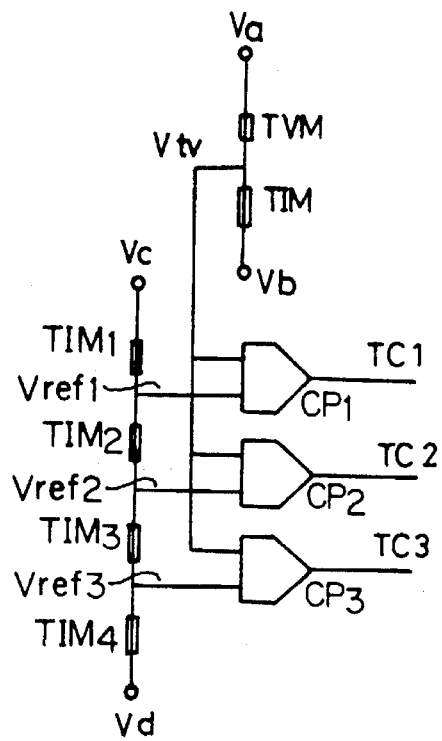
FIG. 5 is a detailed circuit diagram of an embodiment of a reference voltage generator and a temperature sensor in FIG. 4.

FIG. 5 is a detailed circuit diagram of an embodiment of the reference voltage generator 40 and the temperature sensor 31. In this drawing, the reference voltage generator 40 includes components for outputting the reference voltages Vref1–Vref3 and the temperature sensor 31 includes the remaining components. The reference voltage generator 40 includes a plurality of resistors TIM1–TIM4 connected in series between two voltage sources Vc and Vd. Each of the resistors TIM1–TIM4 includes a temperature-invariant material (TIM) which has a resistance with little variation regardless of the temperature variation as shown in FIG. 3. The resistors TIM1–TIM4 are adapted to divide a voltage difference between the two voltage sources Vc and Vd to generate the reference voltages Vref1–Vref3. The reference voltage Vref1 is outputted from a node between the resistors TIM1 and TIM2, the reference voltage Vref2 is outputted from a node between the resistors TIM2 and TIM3 and the reference voltage Vref3 is outputted from a node between the resistors TIM3 and TIM4.

The temperature sensor 31 includes two resistors TVM and TIM connected in series between two voltage sources Va and Vb. The two resistors TVM and TIM constitute a variable voltage generation circuit. The resistor TVM includes a temperature-varying material (TVM) which has a resistance with a large variation with the temperature variation as shown in FIG. 3. The resistors TVM and TIM are adapted to divide a voltage difference between the two voltage sources Va and Vb to generate the voltage Vtv variable with the temperature variation. The variable voltage Vtv is outputted from a node between the resistors TVM and TIM. Also, the temperature sensor 31 includes three comparators CP1–CP3, each of which has one input terminal for inputting a corresponding one of the reference voltages Vref1–Vref3 from the reference voltage generator 40 and the other input terminal for inputting the variable voltage Vtv. The comparators CP1–CP3 compare the variable voltage Vtv with the reference voltages Vref1–Vref3 from the reference voltage generator 40 and output the compared results TC1–TC3 to the temperature controller 32, respectively.

Figure 6:
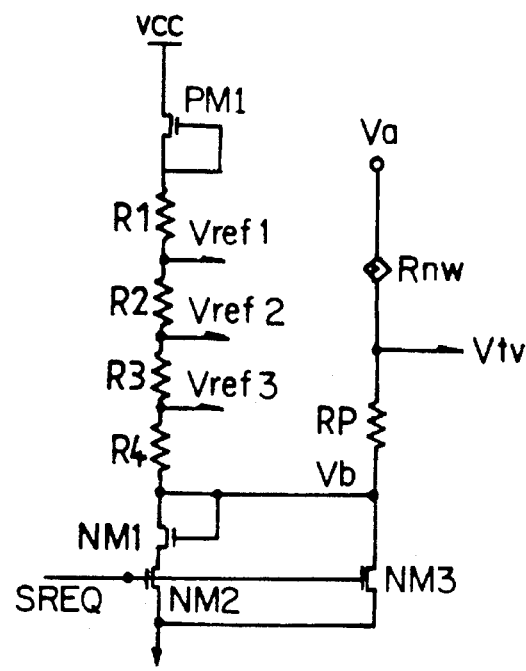
FIG. 6 is a detailed circuit diagram of an alternative embodiment of the reference voltage generator and the temperature sensor in FIG. 4.

Referring to FIG. 6, there is shown a detailed circuit diagram of an alternative embodiment of the reference voltage generator 40 and the temperature sensor 31. As shown in this drawing, the reference voltage generator 40 includes a plurality of polysilicon resistors R1–R4 connected in series between a supply voltage source Vcc and a ground terminal, instead of the resistors TIM1–TIM4 in FIG. 5. Also, the reference voltage generator 40 includes a PMOS transistor PM1 connected between the supply voltage source Vcc and the resistor R1, and NMOS transistors NM1 and NM2 connected in series between the resistor R4 and the ground terminal. The PMOS transistor PM1 has a source connected to the supply voltage source Vcc, and a drain and a gate connected in common to the resistor R1. The NMOS transistor NM1 has a drain and a gate connected in common to the resistor R4, and a source connected to a drain of the NMOS transistor NM2. The NMOS transistor NM2 has a source connected to the ground terminal and a gate for inputting the self refresh request signal SREQ from the refresh controller 22.

The variable voltage generation circuit in the temperature sensor 31 includes an n-well resistor Pnw instead of the resistor TVM in FIG. 5 and a polysilicon resistor RP instead of the resistor TIM in FIG. 5. The n-well resistor Rnw and the polysilicon resistor RP are connected in series between the two voltage sources Va and Vb. Also, the variable voltage generation circuit includes an NMOS transistor NM3 having a drain connected to the voltage source Vb, a source connected to the ground terminal and a gate for inputting the self refresh request signal SREQ from the refresh controller 22. The voltage source Vb forms a node between the polysilicon resistor RP and the drain of the NMOS transistor NM3, which is connected in common to the drain and the gate of the NMOS transistor NM1.

The reference voltage Vref1 is outputted from a node between the resistors R1 and R2, the reference voltage Vref2 is outputted from a node between the resistors R2 and R3 and the reference voltage Vref3 is outputted from a node between the resistors R3 and R4. The variable voltage Vtv is outputted from a node between the n-well resistor Rnw and the polysilicon resistor RP. The PMOS and NMOS transistors PM1 and NM1 function to stabilize a voltage across a string of the resistors R1–R4. When the self refresh request signal SREQ from the refresh controller 22 is high in logic, the NMOS transistor NM2 is turned on, thereby causing current to flow through the resistor string. In result, the use of the NMOS transistor NM2 has the effect of preventing an unnecessary current consumption.

By the way, in designing the reference voltage generator 40 and the temperature sensor 31, the number of resistors to be used must be determined in consideration of the following conditions. Namely, the variable voltage Vtv in FIG. 6 can be expressed by the following equation:

$$Vtv = (Va - Vb) \times RP/(RP + Rnw)$$

Because the n-well resistor Rnw has a resistance varied with the temperature variation, it can be given as follows:

$$Rnw' = Rnw + D(Rnw)$$

where, D(Rnw) is a variation in the resistance of the n-well resistor Rnw with the temperature variation.

The variable voltage Vtv' based on the temperature variation can be expressed as follows:

$$\begin{aligned} Vtv' &= (Va - Vb) \times RP/(RP + Rnw') \\ &= Vtv \times (RP + Rnw)/(RP + Rnw + D(Rnw)) \end{aligned}$$

Then, a variation D(Vtv) of the variable voltage Vtv can be given as follows:

$$\begin{aligned} D(Vtv) &= Vtv - Vtv' \\ &= Vtv \times D(Rnw)/(RP + Rnw + D(Rnw)) \end{aligned}$$

The relationship between a variation D(Vref) of the reference voltage Vref and the variation D(Vtv) of the variable voltage Vtv is:

$$D(Vref) = D(Vtv)/n$$

where, n is 2, 3 and etc.

In the above equation, n is the number of resistors to be used in the resistor string of the reference voltage generator 40. Therefore, the number of resistors must be determined within such a range as to embody the variation D(Vref) of the reference voltage Vref in the device.

Figures 7, 8:
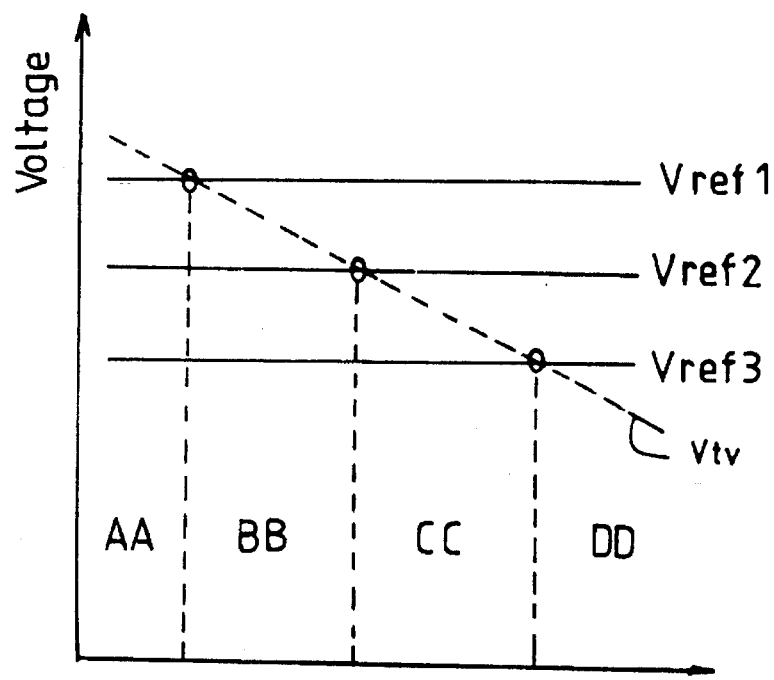
FIG. 7 is a graph illustrating the relationship between a plurality of reference voltages from the reference voltage generator and a variable voltage from the temperature sensor in FIGS. 5 and 6 based on the temperature variation.
FIG. 8 is a table illustrating the relationship between output signals from a plurality of comparators in FIG. 5 and a plurality of temperature regions in FIG. 7 based on the temperature variation.

FIG. 7 is a graph illustrating the relationship between the reference voltages Vref1–Vref3 from the reference voltage generator 40 and the variable voltage Vtv from the temperature sensor 31 based on the temperature variation. In this drawing, the reference numeral AA designates a temperature region up to a point at which the variable voltage Vtv intersects the reference voltage Vref1 as the temperature rises. The reference numeral BB designates a temperature region between points at which the variable voltage Vtv intersects the reference voltages Vref1 and Vref2 as the temperature rises. The reference numeral CC designates a temperature region between points at which the variable voltage Vtv intersects the reference voltages Vref2 and Vref3 as the temperature rises. The reference numeral DD designates a temperature region between points at which the variable voltage Vtv intersects the reference voltages Vref3 and Vref4 as the temperature rises. Although the temperature regions are classified into four in the preferred embodiment of the present invention, they may be subdivided into a larger number as the reference voltages from the reference voltage generator 40 are increased in number.

FIG. 8 is a table illustrating the relationship between the output signals TC1–TC3 from the comparators CP1–CP3 in FIG. 5 and the temperature regions AA, BB, CC and DD in FIG. 7 based on the temperature variation. The comparators CP1–CP3 are adapted to compare the variable voltage Vtv with the reference voltages Vref1–Vref3 from the reference voltage generator 40 and output the compared results TC1–TC3 to the temperature controller 32, respectively. When the variable voltage Vtv are higher than all the reference voltages Vref1–Vref3 from the reference voltage generator 40, the output signals TC1–TC3 from the comparators CP1–CP3 become all high (H) in logic. On the contrary, if the variable voltage Vtv are lower than all the reference voltages Vref1–Vref3 from the reference voltage generator 40, the output signals TC1–TC3 from the comparators CP1–CP3 become all low (L) in logic. In the temperature region AA, the variable voltage Vtv are higher than all the reference voltages Vref1–Vref3 as shown in FIG. 7. As a result, the output signals TC1–TC3 from the comparators CP1–CP3 become all high in logic as shown in FIG. 8. In the temperature region BB, the variable voltage Vtv is lower than the reference voltage Vref1 and higher than the reference voltages Vref2 and Vref3. As a result, the output signal TC1 from the comparator CP1 becomes low in logic, whereas the output signals TC2 and TC3 from the comparators CP2 and CP3 become high in logic. Then, the output signals TC1–TC3 from the temperature sensor 31 are applied to the temperature controller 32.

Figure 9:
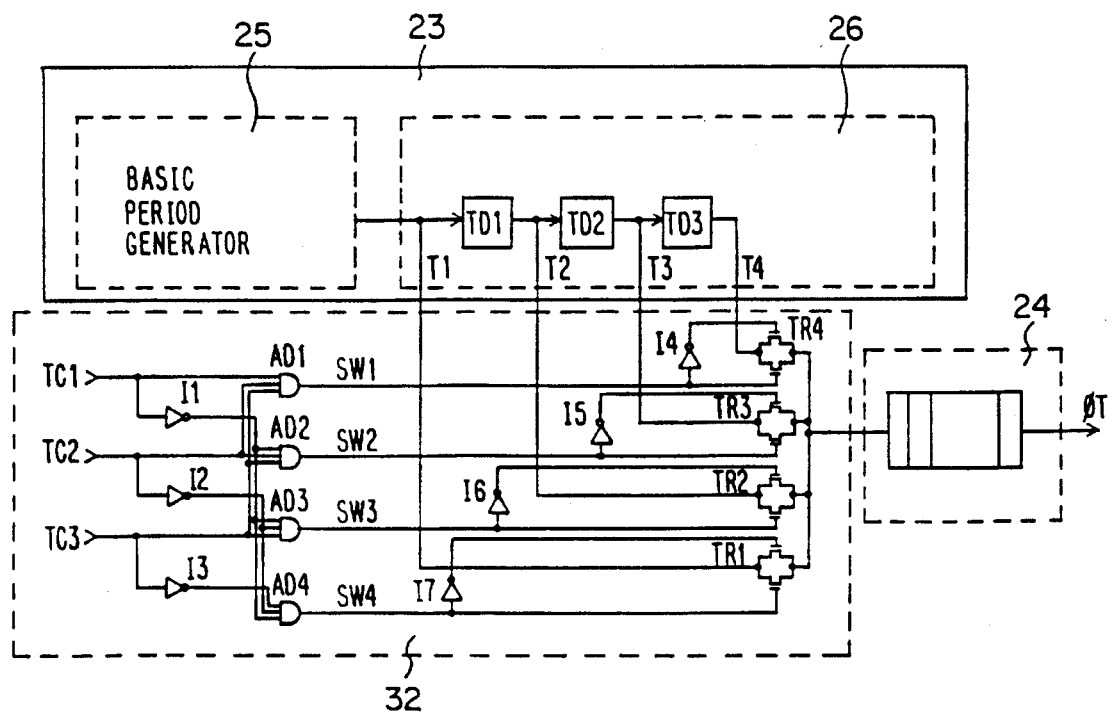
FIG. 9 is a detailed circuit diagram of an embodiment of a timer, a temperature controller and a frequency divider in FIG. 4.

Referring to FIG. 9, there is shown a detailed circuit diagram of an embodiment of the timer 23, the temperature controller 32 and the frequency divider 24 in FIG. 4. As shown in this drawing, the temperature controller 32 includes three inverters I1–I3 for inverting the output signals TC1–TC3 from the temperature sensor 31, respectively, an AND gate AD1 for ANDing the output signals TC1–TC3 from the temperature sensor 31 and outputting the resultant signal SW1, an AND gate AD2 for ANDing an output signal from the inverter I1 and the output signals TC2 and TC3 from the temperature sensor 31 and outputting the resultant signal SW2, an AND gate AD3 for ANDing the output signal from the inverter I1, an output signal from the inverter I2 and the output signal TC3 from the temperature sensor 31 and outputting the resultant signal SW3, and an AND gate AD4 for ANDing the output signal from the inverter I1, the output signal from the inverter I2 and an output signal from the inverter I3 and outputting the resultant signal SW4. The output signals SW1–SW4 from the AND gates AD1–AD4 are directly applied to one input terminals of transmission gates TR1–TR4, respectively. Also, the output signals SW1–SW4 from the AND gates AD1–AD4 are inverted by inverters I4–I7 and then applied to the other input terminals of the transmission gates TR1–TR4, respectively. As a result, the transmission gates TR1–TR4 are switched in response to the output signals SW1–SW4 from the AND gates AD1–AD4 and the inverted ones thereof, respectively.

The timer 23 in the SR mode control circuit 20 includes a basic period generator 25 for generating a basic period in response to the SR mode start signal from the SR mode start signal output unit 21 and a counting circuit 26 for counting the basic period from the basic period generator 25. The counting circuit 26 includes a plurality of counters TD1–TD3 for counting the basic period from the basic period generator 25, respectively. The counting circuit 26 inputs the basic period from the basic period generator 25 and outputs directly as a signal T1. Also in the counting circuit 26, the counter TD1 counts the basic period from the basic period generator 25 and outputs the resultant signal T2 (T1×2$^1$). The counter TD2 counts the output signal T2 from the counter TD1 and outputs the resultant signal T3 (T2× 2$^1$=T1×2$^2$). The counter TD3 counts the output signal T3 from the counter TD2 and outputs the resultant signal T4. In result, the counters TD1–TD3 in the counting circuit 26 frequency-divide sequentially the basic period from the basic period generator 25 by a square number of 2. Then, the output signals T1–T4 from the counting circuit 26 are applied to the transmission gates TR1–TR4, respectively. The transmission gates TR1–TR4 are switched in response to the switching control signals SW1–SW4 from the AND gates AD1–AD4 to select a desired one of the output signals T1–T4 from the counting circuit 26 and output the selected signal to the frequency divider 24.

Figure 10:
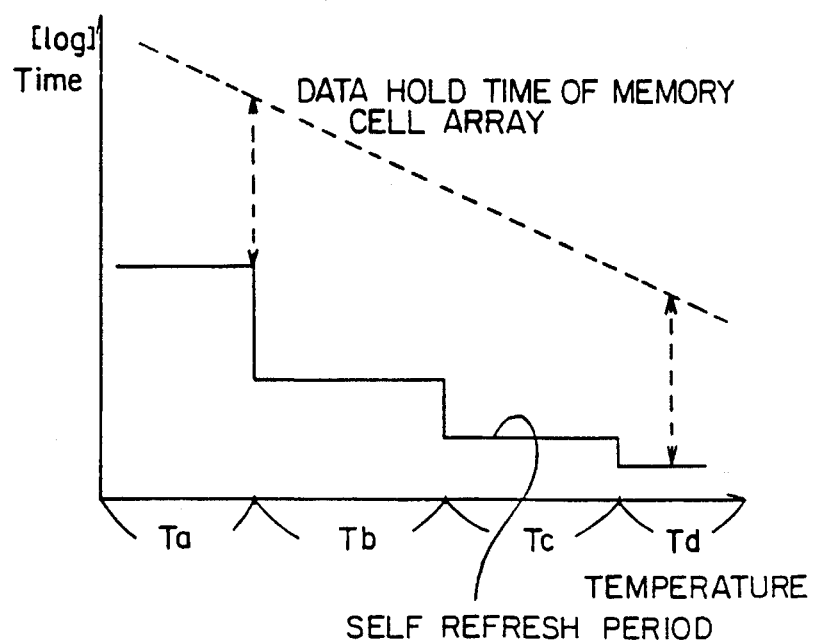
FIG. 10 is a graph illustrating the relationship between a data hold time and a plurality of self refresh periods based on the temperature variation in accordance with the present invention.

In the temperature region AA, because the output signals TC1–TC3 from the comparators CP1–CP3 are all high in logic, the output signal SW1 from the AND gate AD1 in the temperature controller 32 becomes high in logic, whereas the remaining AND gates AD2–AD4 become all low in logic. As a result, the transmission gate TR4 is turned on, so as to transfer the output signal T4 from the counter TD3 in the counting circuit 26 to the frequency divider 24. In result, in the temperature region AA, the frequency-divided signal has a level in an interval Ta of FIG. 10. In the temperature region DD, because the output signals TC1–TC3 from the comparators CP1–CP3 are all low in logic, the output signal SW4 from the AND gate AD4 in the temperature controller 32 becomes high in logic, whereas the remaining AND gates AD1–AD3 become all low in logic. As a result, the transmission gate TR1 is turned on, so as to transfer the output signal T1 from the counting circuit 26 to the frequency divider 24. In result, in the temperature region DD, the frequency-divided signal has a level in an interval Td of FIG. 10.

Subsequently, the frequency divider 24 generates the time-divided timing signal $\phi_T$ in response to the output signal from each of the transmission gates TR1–TR4 and outputs the generated time-divided timing signal $\phi_T$ to the refresh counter 4. Then, the refresh counter 4 counts the time-divided timing signal $\phi_T$ from the frequency divider 24 and outputs the self refresh operating signal in accordance with the counted result. In result, the self refresh operation of the memory cell array 10 is performed in response to the self refresh operating signal from the refresh counter 4.

Figure 11:
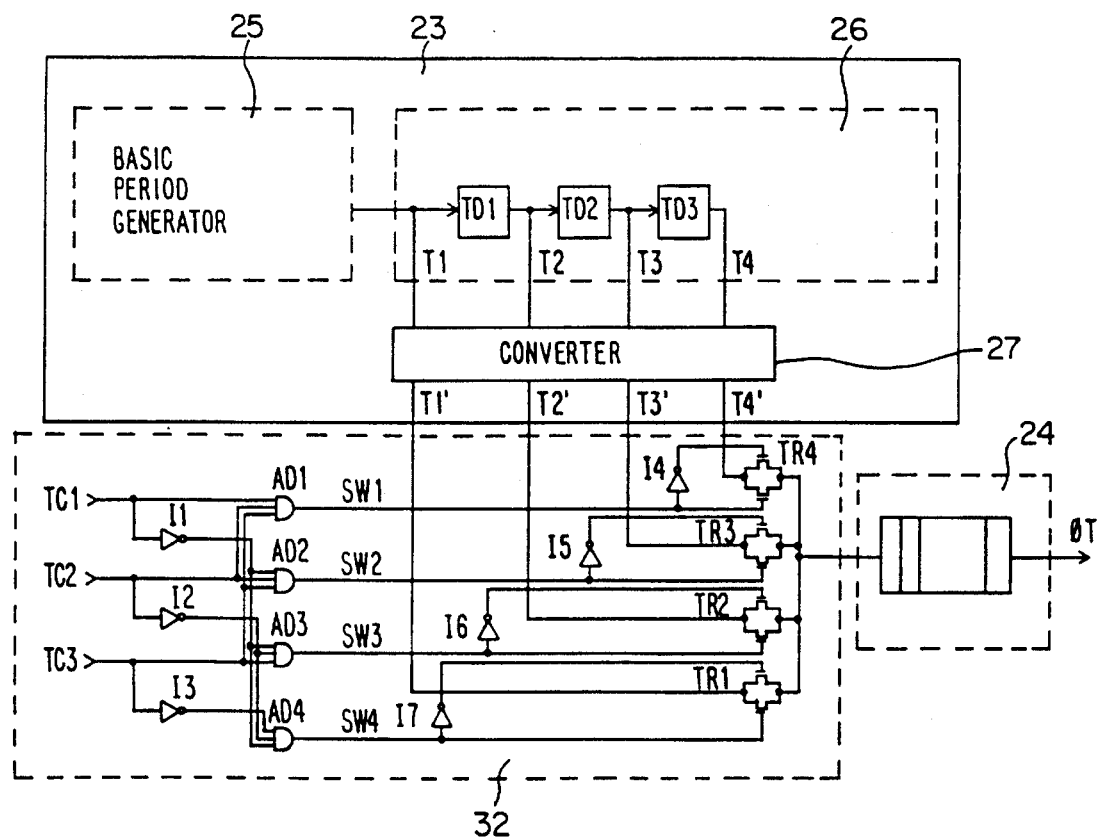
FIG. 11 is a detailed circuit diagram of an alternative embodiment of the timer in FIG. 4.

Referring to FIG. 11, there is shown a detailed circuit diagram of an alternative embodiment of the timer 23. The construction of this drawing is the same as that of FIG. 9, with the exception that the timer 23 further includes a converter 27. The output signals T1–T4 from the counting circuit 26 are obtained by frequency-dividing the basic period from the basic period generator 25 by the square number of 2. Then, the converter 27 converts the output signals T1–T4 from the counting circuit 26 into n times 2 or linear multiple signals T1'–T4'. Therefore, the self refresh periods based on the temperature regions become more constant in variation than those in FIG. 10.

As apparent from the above description, according to the present invention, the temperature sensor is disposed in the memory device and the temperatures sensed by the temperature sensor are classified into the plurality of regions. Therefore, the temperature variation of the memory cell array can accurately be sensed and the self refresh period can be adjusted according to the accurately sensed temperature variation of the memory cell array. Also, the single timer is used to generate the plurality of self refresh periods. Therefore, the self refresh control circuit for the memory cell array has the effect of reducing the chip area.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A self refresh control circuit for a memory cell array comprising a plurality of address buffers for inputting addresses of said memory cell array and a plurality of decoders for decoding the addresses from said address buffers, wherein the improvement comprises:

self refresh mode control means for controlling a self refresh operation of said memory cell array in response to a row address strobe signal and a column address strobe signal;

reference voltage generation means for generating a plurality of reference voltages, each of said reference voltages being nearly constant in level regardless of a temperature variation in a chip; and temperature tracing means for generating a voltage variable with the temperature variation in the chip, comparing the generated variable voltage with the reference voltages from said reference voltage generation means, respectively, selecting a desired one of a plurality of self refresh periods from said self refresh mode control means in accordance with the compared results and outputting the selected self refresh period to said self refresh mode control means.

2. A self refresh control circuit for a memory cell array as set forth in claim 1, wherein said self refresh mode control means includes:

a self refresh mode start signal output unit for starting the self refresh operation of said memory cell array if the row and column address strobe signals remain at a specified logic state for a predetermined time period;

a timer for generating the plurality of self refresh periods in response to a start signal from said self refresh mode start signal output unit and outputting the generated self refresh periods to said temperature tracing means;

a refresh controller responsive to the start signal from said self refresh mode start signal output unit, for outputting a self refresh request signal and controlling said address buffers to block the addresses therefrom to said memory cell array; and a frequency divider for outputting a self refresh operating signal in response to the selected self refresh period from said temperature tracing means.

3. A self refresh control circuit for a memory cell array as set forth in claim 2, wherein said timer includes:

a basic period generator for generating a basic period in response to the start signal from said self refresh mode start signal output unit; and counting means for frequency-dividing the basic period from said basic period generator to generate the plurality of self refresh periods and outputting the generated self refresh periods to said temperature tracing means.

4. A self refresh control circuit for a memory cell array as set forth in claim 3, wherein said counting means includes a plurality of counters connected in series to said basic period generator to frequency-divide sequentially the basic period from said basic period generator by a square number of 2, said counting means outputting the basic period from said basic period generator and output signals from said plurality of counters as the self refresh periods to said temperature tracing means.

5. A self refresh control circuit for a memory cell array as set forth in claim 3, wherein said timer further includes a converter for converting a plurality of output signals from said counting means into linear multiple signals.

6. A self refresh control circuit for a memory cell array as set forth in claim 1, wherein said temperature tracing means includes:

a temperature sensor for generating the voltage variable with the temperature variation;

a plurality of comparators for comparing the generated variable voltage from said temperature sensor with the reference voltages from said reference voltage generation means, respectively; and a temperature controller for selecting the desired one of the plurality of self refresh periods from said self refresh mode control means in response to output signals from said plurality of comparators and outputting the selected self refresh period to said self refresh mode control means.

7. A self refresh control circuit for a memory cell array as set forth in claim 6, wherein said temperature sensor is disposed at a plurality of positions in said memory cell array to output the average of sensed temperatures.

8. A self refresh control circuit for a memory cell array as set forth in claim 1, wherein said reference voltage generation means includes a plurality of resistors connected in series between first and second voltage sources to divide a voltage difference between said first and second voltage sources and output the divided voltages as the reference voltages at respective nodes between adjacent ones thereof, each of said plurality of resistors including a temperature-invariant material which has a resistance with little variation regardless of the temperature variation.

9. A self refresh control circuit for a memory cell array as set forth in claim 8, wherein said temperature-invariant material is polysilicon.

10. A self refresh control circuit for a memory cell array as set forth in claim 8, wherein said first voltage source is a supply voltage source and said second voltage source is a ground voltage source, and wherein said reference voltage generation means further includes:

a PMOS transistor connected between said supply voltage source and one side of a string of said plurality of resistors; and a first NMOS transistor connected between the other side of said resistor string and said ground voltage source;

said PMOS transistor and said first NMOS transistor acting to stabilize a voltage across said resistor string.

11. A self refresh control circuit for a memory cell array as set forth in claim 10, wherein said reference voltage generation means further includes a second NMOS transistor having a drain connected to a source of said first NMOS transistor, a source connected to said ground voltage source and a gate for inputting a self refresh request signal from said self refresh mode control means, said second NMOS transistor allowing the reference voltages to be outputted from said nodes of said resistors when the self refresh request signal from said self refresh mode control means is high in logic, so as to reduce current consumption.

12. A self refresh control circuit for a memory cell array as set forth in claim 6, wherein said temperature sensor includes first and second resistors connected in series between first and second voltage sources to divide a voltage difference between said first and second voltage sources and output the divided voltage as the variable voltage at a node therebetween, said first resistor including a temperature-varying material which has a resistance with a large variation with the temperature variation, said second resistor including a temperature-invariant material which has a resistance with little variation regardless of the temperature variation.

13. A self refresh control circuit for a memory cell array as set forth in claim 12, wherein said first resistor is an n-well resistor.

14. A self refresh control circuit for a memory cell array as set forth in claim 12, wherein said temperature-invariant material is polysilicon.

15. A self refresh control circuit for a memory cell array as set forth in claim 12, wherein said temperature sensor further includes an NMOS transistor having a drain connected to said second resistor through said second voltage source, a source connected to a ground terminal and a gate for inputting a self refresh request signal from said self refresh mode control means, said NMOS transistor allowing the variable voltage to be outputted from said node of said first and second resistors when the self refresh request signal from said self refresh mode control means is high in logic, so as to reduce current consumption.

16. A self refresh control circuit for a memory cell array as set forth in claim 6, wherein said plurality of comparators are n in number and said temperature controller includes:

first to nth inverters for inverting the output signals from said first to nth comparators, respectively;

a first AND gate for ANDing the output signals from said first to nth comparators;

a second AND gate for ANDing the output signals from said second to nth comparators and an output signal from said first inverter;

a third AND gate for ANDing the output signals from said third to nth comparators, the output signal from said first inverter and an output signal from said second inverter;

fourth to nth AND gates for ANDing the output signals from said fourth to nth comparators, the output signals from said first and second inverters and output signals from said third to n−1th inverters in the same manner as that of said third AND gate;

an n+1th AND gate for ANDing the output signals from said first to nth inverters; and n+1 transmission gates for selecting the desired one of the plurality of self refresh periods from said self refresh mode control means in response to output signals from said first to n+1th AND gates and outputting the selected self refresh period to said self refresh mode control means.

17. A self refresh control circuit for a memory cell array as set forth in claim 4, wherein said plurality of counters are determined in number according to the number of classified temperature regions.

\* \* \* \* \*